(12) United States Patent
Hiroki

(10) Patent No.: US 7,622,008 B2
(45) Date of Patent: Nov. 24, 2009

(54) GATE VALVE AND VACUUM CONTAINER FOR SEMICONDUCTOR PROCESSING SYSTEM

(75) Inventor: Tsutomu Hiroki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 672 days.

(21) Appl. No.: 10/548,446

(22) PCT Filed: Feb. 27, 2004

(86) PCT No.: PCT/JP2004/002431

§ 371 (c)(1),
(2), (4) Date: Sep. 9, 2005

(87) PCT Pub. No.: WO2004/081996

PCT Pub. Date: Sep. 23, 2004

(65) Prior Publication Data

US 2006/0196422 A1 Sep. 7, 2006

(30) Foreign Application Priority Data

Mar. 11, 2003 (JP) .............................. 2003-065606

(51) Int. Cl.
*C23C 16/00* (2006.01)
*H01L 21/677* (2006.01)
*C23F 1/00* (2006.01)

(52) U.S. Cl. .................. 118/733; 118/719; 156/345.31; 156/345.32; 414/217; 414/935; 414/939

(58) Field of Classification Search ................. 118/719; 156/345.31, 345.32; 414/939
See application file for complete search history.

(56) References Cited

U.S. PATENT DOCUMENTS 5,751,003 A * 5/1998 Rose et al. ............. 250/492.21
6,698,718 B2 * 3/2004 Yoo .......................... 251/309

FOREIGN PATENT DOCUMENTS

JP 2001-160578 6/2001
JP 2001-324032 11/2001

* cited by examiner

*Primary Examiner*—Karla Moore
(74) *Attorney, Agent, or Firm*—Oblon, Spivak, McClelland, Maier & Neustadt, L.L.P.

(57) ABSTRACT

A gate valve (20) for a semiconductor processing system includes a housing (21) forming a plurality of passages (22A to 22D) arrayed in a first direction. The passages respectively have ports (23A to 23D) facing a first predetermined side in a second direction perpendicular to the first direction. The ports are respectively provided with valve seats (25A to 25D) at gradually set back positions in the second direction, as being closer to a second predetermined side in the first direction. Valve plates (24A to 24D) are arrayed in the second direction to open/close the ports. The valve plates are slid by an actuating mechanism (30A to 30D).

12 Claims, 9 Drawing Sheets

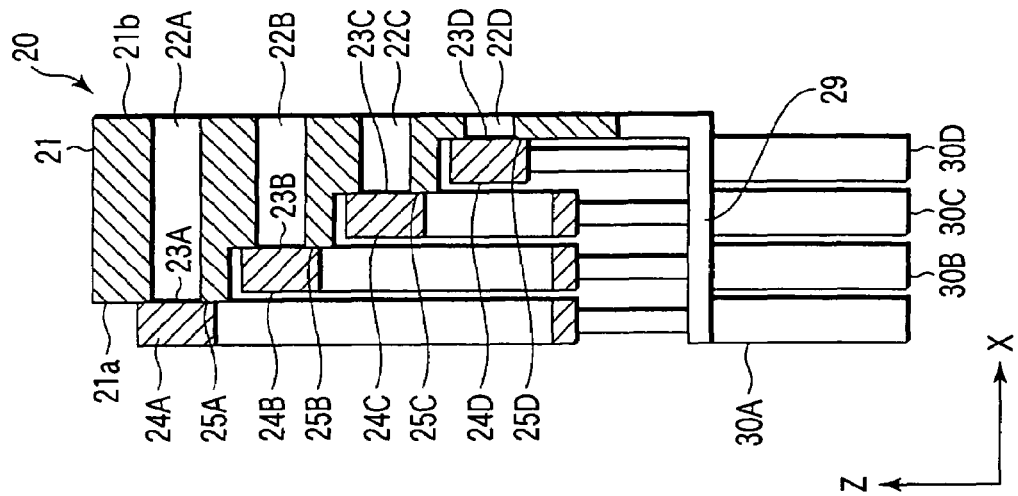
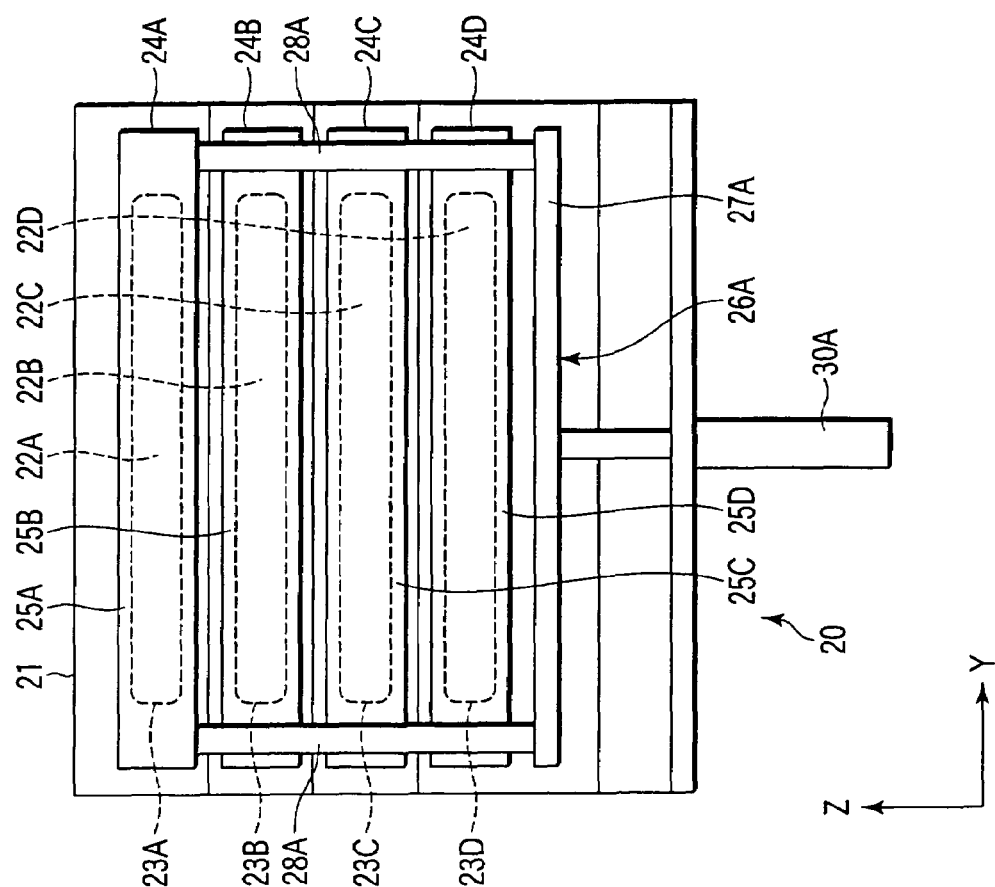
FIG. 1B
FIG. 1A

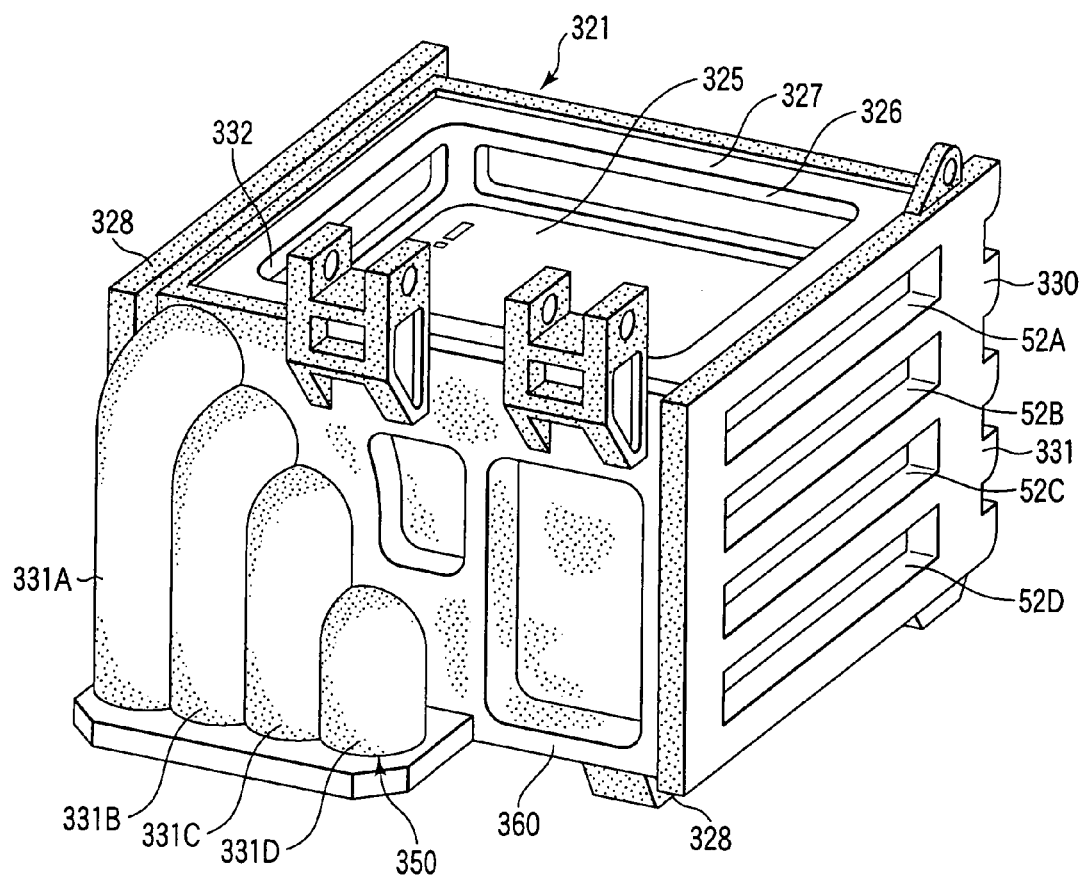
F I G. 9

GATE VALVE AND VACUUM CONTAINER FOR SEMICONDUCTOR PROCESSING SYSTEM

CROSS-REFERENCE TO RELATED APPLICATIONS

The present application is the U.S. National Phase Application under 35 U.S.C. § 371 of International Application PCT/JP2004/002431 (not published in English), filed Feb. 27, 2004.

TECHNICAL FIELD

The present invention relates to a gate valve for opening/closing a target substrate transfer passage in a semiconductor processing system, and a vacuum container including such a gate valve for a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

BACKGROUND ART

There is a semiconductor processing system of the cluster tool type, which has load-lock chambers and vacuum process chambers disposed around a vacuum transfer chamber. Further, there is a vacuum processing system that has a load-lock chamber and a vacuum process chamber stacked one on the other to reduce the installation space (for example, Jpn. Pat. Appln. KOKAI Publication No. 2001-160578). Vacuum processing systems of this kind includes gate valves respectively disposed between chambers to maintain the chambers and so forth airtight, because target substrates need to be transferred within vacuum environments.

FIG. 10 is a sectional side view showing a conventional vacuum processing system. In FIG. 10, process chambers 2 and load-lock chambers 3 are connected to a transfer chamber 1. A gate valve 5 is disposed between the transfer chamber 1 and each of the process chambers 2 and load-lock chambers 3. The transfer chamber 1 is provided with a transfer robot 6 disposed therein to transfer a target substrate between a load-lock chamber 3 and a process chamber 2, or between two process chambers 2. In general, a gate valve 5 used in this field has a valve plate for opening/closing a target substrate transfer passage, wherein the valve plate is arranged to slide in a direction perpendicular to a direction in which the passage penetrates (for example, Jpn. Pat. Appln. KOKAI Publication No. 2-113178).

In the conventional vacuum processing system shown in FIG. 10, vacuum chambers, such as the process chambers 2 and load-lock chambers 3, are stacked one on the other, so that the number of process chambers 2 and load-lock chamber 3 can be increased without increase in the installation area. However, where vacuum chambers are stacked, the gate valves 5 are inevitably arrayed in the same vertical direction. As a consequence, a problem arises such that a sufficient configuration space cannot be ensured for the drive system of the gate valves 5, and thus the number of vacuum chambers to be stacked and the intervals therebetween are limited.

DISCLOSURE OF INVENTION

An object of the present invention is to provide a gate valve and vacuum container for a semiconductor processing system, which have a plurality of stacked passages and are compact.

According to a first aspect of the present invention, there is provided a gate valve for a semiconductor processing system, comprising:

a housing forming a plurality of passages arrayed in a first direction, the passages respectively having ports facing a first predetermined side in a second direction perpendicular to the first direction;

valve seats respectively disposed at the ports, the valve seats being respectively disposed at gradually set back positions in the second direction, as being closer to a second predetermined side in the first direction;

valve plates configured to selectively engage with the valve seats by sliding in the first direction to respectively open/close the ports, the valve plate being arrayed in the second direction correspondingly to positions of the valve seats in the second direction; and an actuating mechanism configured to slide the valve plates between a first position to close the ports and a second position to open the ports.

According to a second aspect of the present invention, there is provided a vacuum container for a semiconductor processing system, comprising:

a container body forming a plurality of vacuum chambers arrayed in a first direction; and a first gate valve disposed at a first end of the container body and configured to open/close the vacuum chambers, where the first gate valve comprises a housing forming a plurality of passages arrayed in the first direction and respectively communicating with the vacuum chambers, the passages respectively having ports facing a first predetermined side in a second direction perpendicular to the first direction, valve seats respectively disposed at the ports, the valve seats being respectively disposed at gradually set back positions in the second direction, as being closer to a second predetermined side in the first direction, valve plates configured to selectively engage with the valve seats by sliding in the first direction to respectively open/close the ports, the valve plate being arrayed in the second direction correspondingly to positions of the valve seats in the second direction, and an actuating mechanism configured to slide the valve plates between a first position to close the ports and a second position to open the ports.

According to a third aspect of the present invention, there is provided a gate valve housing unit for a semiconductor processing system, comprising:

a housing forming a plurality of passages arrayed in a first direction, the passages respectively having ports facing a first predetermined side in a second direction perpendicular to the first direction; and valve seats respectively disposed at the ports, the valve seats being respectively disposed at gradually set back positions in the second direction, as being closer to a second predetermined side in the first direction.

According to a fourth aspect of the present invention, there is provided a gate valve operation unit for a semiconductor processing system, the gate valve comprising ports respectively provided with valve seats, which are arrayed in a first direction and are respectively disposed at gradually set back positions in a second direction perpendicular to the first direction, the operation unit comprising:

valve plates configured to selectively engage with the valve seats by sliding in the first direction to respectively open/close the ports, the valve plate being arrayed in the second direction correspondingly to positions of the valve seats in the second direction; and an actuating mechanism configured to slide the valve plates between a first position to close the ports and a second position to open the ports.

BRIEF DESCRIPTION OF DRAWINGS

FIGS. 1A and 1B are a front view and a sectional side view, respectively, showing a gate valve according to an embodiment of the present invention;

FIG. 9 is a perspective view showing a vacuum container according to still another embodiment of the present invention.

BEST MODE FOR CARRYING OUT THE INVENTION

Figure 2A:
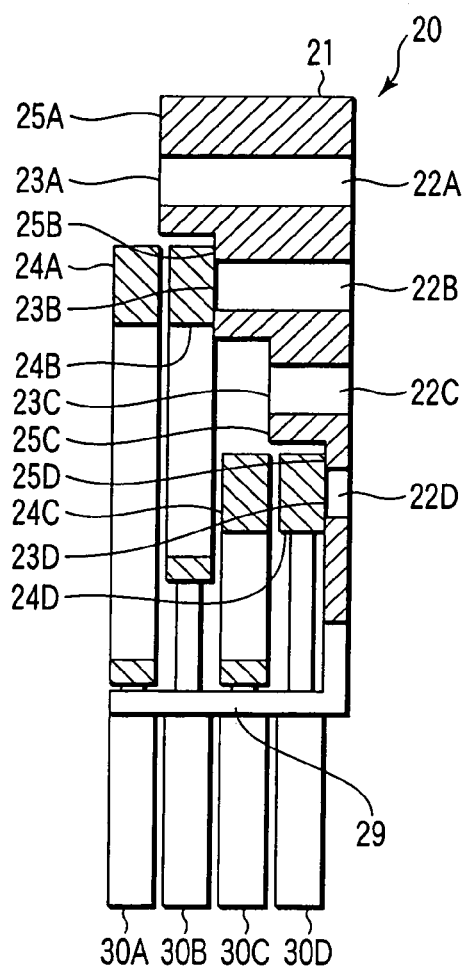
FIG. 2A is a sectional side view showing a state of the gate valve where the first and third level passages from the top are opened.

Embodiments of the present invention will be described hereinafter with reference to the accompanying drawings. In the following description, the constituent elements having substantially the same function and arrangement are denoted by the same reference numerals, and a repetitive description will be made only when necessary.

FIGS. 1A and 1B are a front view and a sectional side view, respectively, showing a gate valve according to an embodiment of the present invention. This gate valve 20 defines one unit in which a plurality of valve functions are stacked to form a multi-layer structure. The gate valve 20 is integrated with a container body, as described later, to form a vacuum container of a multi-layer type that defines, e.g., process chambers or load-lock chambers.

As shown in FIGS. 1A and 1B, the gate valve 20 includes a housing 21, which forms a plurality of passages 22A to 22D arrayed in a vertical Z-direction (a first direction). The passages respectively have front-end ports 23A to 23D facing a front-end face 21a in a horizontal X-direction (i.e., a second direction perpendicular to the first direction). Valve seats (seats of valve portions) 25A to 25D are respectively formed around the ports 23A to 23D. The valve seats 25A to 25D are respectively disposed at gradually set back positions in the X-direction, as their positions are closer to the lower side.

A plurality of valve plates (discs of valve portions) 24A to 24D are used for opening/closing the ports 23A to 23D. The valve plates 24A to 24D are arranged to slide in the Z-direction, so as to selectively engage with the valve seats 25A to 25D. The valve plates 24A to 24D are arrayed in the X-direction, correspondingly to the positions of the valve seats 25A to 25D in the X-direction. The valve plates 24A to 24D are driven by actuating mechanisms 30A to 30D. The actuating mechanisms 30A to 30D slide the valve plates 24A to 24D between first positions to close the ports 23A to 23D and second positions to open the ports 23A to 23D, respectively.

More specifically, the plurality of (four in this example) passages 22A to 22D penetrate the housing 21 in the X-direction and are stacked in the Z-direction to be parallel with each other. The front-end face 21a of the housing 21 has steps corresponding to the passages 22A to 22D. The front-end ports 23A to 23D of the passages 22A to 22D, and the valve seats 25A to 25D respectively surrounding the ports 23A to 23D are formed in the vertical faces of the steps. The valve seats 25A to 25D are respectively provided with seal members or the like (not shown) for ensuring sealing properties. The rear-end face 21b of the housing 21 is simply flat.

The valve plates 24A to 24D are disposed at the front-end face 21a of the housing 21 to independently open/close the ports 23A to 23D of the passages 22A to 22D. Accordingly, the number of valve plates 24A to 24D is the same as the number of passages 22A to 22D. The valve plates 24A to 24D slide in the Z-direction to respectively open/close the passages 22A to 22D. When the valve plates 24A to 24D slide to closing positions, they come into close contact with the valve seats 25A to 25D, thereby closing the passages 22A to 22D.

In this embodiment, all the passages 22A to 22D are closed by upstroke slide of the valve plates 24A to 24D. The valve seats 25A to 25D are respectively disposed at gradually set back positions from the front end toward the rear end, e.g., at regular intervals in the X-direction, as their positions are shifted from the uppermost position to the lowermost position. The valve plates 24A to 24D are also disposed at regular intervals in the X-direction, correspondingly to the regular intervals of the valve seats 25A to 25D in the X-direction. The actuating mechanisms 30A to 30D are formed of air cylinders or the like, which slide the valve plates 24A to 24D independently of each other. The actuating mechanisms 30A to 30D are disposed below the housing 21 in the same order as the corresponding valve plates 24A to 24D.

Specifically, the valve seat 25A, valve plate 24A, and actuating mechanism 30A for the uppermost passage 22A are disposed at the foremost position in the X-direction. On the other hand, the valve seat 25D, valve plate 24D, and actuating mechanism 30D for the lowermost passage 22D are disposed at the rearmost position in the X-direction. The valve seats 25B and 25C, valve plates 24B and 24C, and actuating mechanisms 30B and 30C for the second and third level passages 22B and 22C from the top are disposed in this order between the foremost and rearmost positions in the X-direction.

The slide strokes (travelling distances) of the valve plates 24A to 24D for opening/closing the passages 22A to 22D are set to be the same. Thus, the actuating mechanisms 30A to 30D, which have the same stroke and the same specifications, are arrayed and fixed to the bottom frame 29 of the housing 21.

In this embodiment, since the slide strokes of the valve plates 24A to 24D are set as described above, two ports vertically adjacent to each other cannot be opened at the same time. When the upper valve plate is opened, the valve plate is kept at the same height level as the lower valve plate next thereto, and, i.e., it is not moved further to the level of the still lower port. However, ports at alternate height levels can be opened at the same time by moving the corresponding valve plates, so that transfer objects (target substrates) can be respectively transferred into and from passages at alternate height levels.

FIG. 2A is a sectional side view showing a state of the gate valve 20 where the first and third level passages from the top are opened. As shown in FIG. 2A, the first and third level valve plates 24A and 24C have been moved down to open positions. In this case, the first and third level valve plates 24A and 24C are kept at the same height levels as the second and fourth level valve plates 24B and 24D next thereto on the lower side. Accordingly, the first and third level ports 23A and 23C can be opened at the same time, but they cannot be opened along with the ports 23B and 23D at the same time.

Figure 2B:
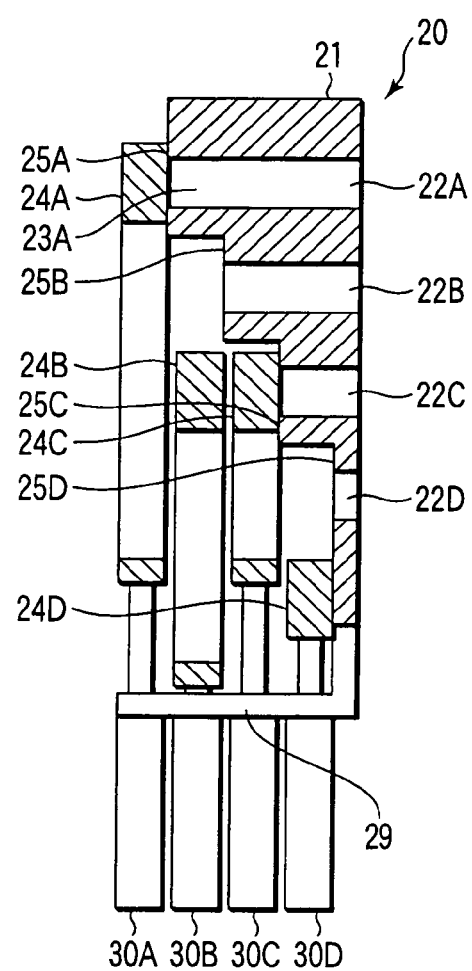
FIG. 2B is a sectional side view showing a state of the gate valve where the second and fourth level passages from the top are opened.

FIG. 2B is a sectional side view showing a state of the gate valve 20 where the second and fourth level passages from the top are opened. As shown in FIG. 2B, the second and fourth level valve plates 24B and 24D have been moved down to open positions. In this case, the second level valve plate 24B is kept at the same height level as the third level valve plate 24C next thereto on the lower side. Accordingly, the second and fourth level ports 23B and 23D can be opened at the same time, but they cannot be opened along with the port 23C at the same time.

As described above, the slide strokes of the valve plates 24A to 24D are set to be essentially the same as the pitch of the ports 23A to 23D of the passages 22A to 22D in the Z-direction. With this arrangement, it is possible to minimize the size of the actuating mechanisms 30A to 30D of the valve plates 24A to 24D, which contributes to making the entire gate valve 20 more compact.

Figure 3:
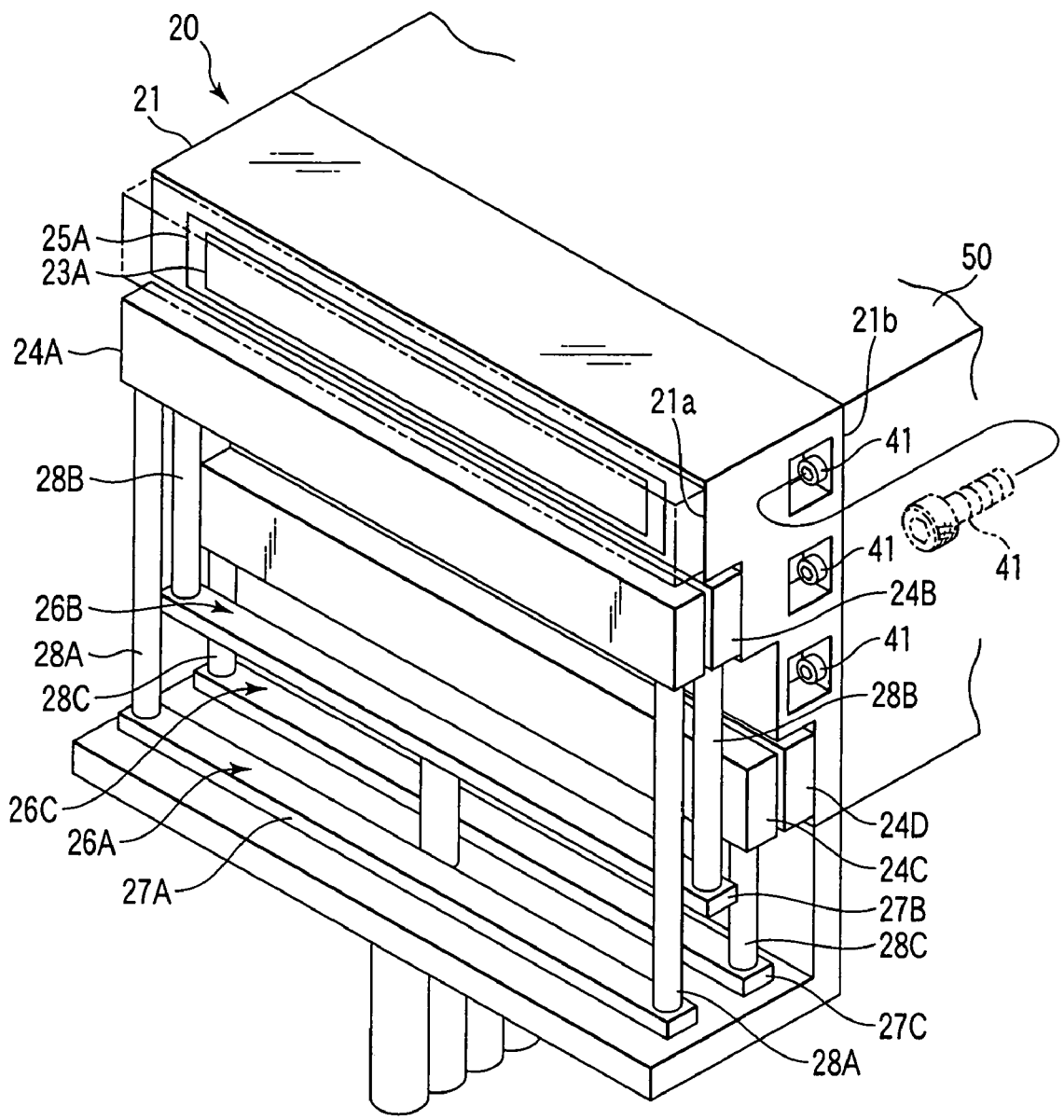
FIG. 3 is a perspective view showing a state of the gate valve, from diagonally ahead and above on the right side, where the first and third level passages from the top are opened.

FIG. 3 is a perspective view showing a state of the gate valve 20, from diagonally ahead and above on the right side, where the first and third level passages from the top are opened. As shown in FIGS. 1A and 3, the valve plates 24A to 24C of the first to third levels from the top are connected to the distal ends of the reciprocation rods of the actuating mechanisms 30A to 30C, through lifting frames 26A to 26C, respectively. The lifting frames 26A to 26C respectively include horizontal bars 27A to 27C, which are respectively connected to the distal ends of the reciprocation rods of the actuating mechanisms 30A to 30C, and extend in the width direction of the valve plates 24A to 24C (a Y-direction). Pairs of rods 28A to 28C are disposed upright at the opposite ends of the horizontal bars 27A to 27C, respectively, in the longitudinal direction. The distance between the pair of rods 28A to 28C is set to be larger than the width of a transfer object passing through the ports 23A to 23D.

With this arrangement, the lifting frames 26A to 26C (particularly the rods 28A to 28C) for vertically moving the valve plates 24A to 24C do not interfere with a transfer object moved into and from the other ports 23A to 23D. In other words, the spaces between the pairs of rods 28A to 28C are utilized to move a transfer object into and from the lower ports 23B to 23D. Furthermore, the pairs of rods 28A to 28C help the valve plates 24A to 24C slide in a stable state without inclination.

The gate valve 20 thus arranged can provide the following effects.

The valve plates 24A to 24D for opening/closing the passages 22A to 22D are gradually shifted in the X-direction. Accordingly, the valve plates 24A to 24D do not interfere with each other, and the drive systems of the valve plates 24A to 24D do not interfere with each other. Furthermore, the valve plates 24A to 24D are disposed at small intervals in the Z-direction, and the vertical intervals of the passages 22A to 22D are also set small correspondingly thereto. The actuating mechanisms 30A to 30D of the valve plates 24A to 24D are arrayed in the X-direction, while being set at the same height. As a consequence, the gate valve 20 can define a compact unit in which a plurality of valve functions are stacked to form a multi-layer structure.

The movable portions of the valve plates 24A to 24D are all disposed below the ports 23A to 23D of the passages 22A to 22D. Accordingly, particles generated from the movable portions can be prevented from reaching the moving area of transfer objects, as far as possible. In addition, the valve seats 25A to 25D of the respective levels are disposed at gradually set back positions from the front end toward the rear end, as their positions are shifted from the uppermost position to the lowermost position. Accordingly, even if particles drop from near the upper level valve seats 25A to 25C, they are essentially not trapped near the lower level ports 23B to 23D, but only drop further as they are. As a consequence, this structure is effective as a countermeasure against ill effects of particles.

In the embodiment described above, all the passages 22A to 22D are closed by upstroke slide of the valve plates 24A to 24D. However, the structure may be arranged such that all the passages 22A to 22D are closed by downstroke slide of the valve plates 24A to 24D. Such a gate valve can be structured by turning the gate valve 20 shown in FIGS. 1A and 1B upside down.

Specifically, in this modification, all passages 22A to 22D are closed when valve plates 24A to 24D are slid down. Valve seats 25A to 25D are disposed at gradually set back positions from the front end toward the rear end, e.g., at regular intervals in the X-direction, as their positions are shifted from the lowermost position to the uppermost position. The valve plates 24A to 24D are also disposed at regular intervals in the X-direction, correspondingly to the regular intervals of the valve seats 25A to 25D in the X-direction. Actuators 30A to 30D are disposed above a housing 21 in the same order as the corresponding valve plates 24A to 24D.

For the gate valve with the actuating mechanisms 30A to 30D disposed on the upper side, the space below the housing 21 can be effectively utilized. Accordingly, this brings about advantages, such as ease of maintenance.

Figure 4:
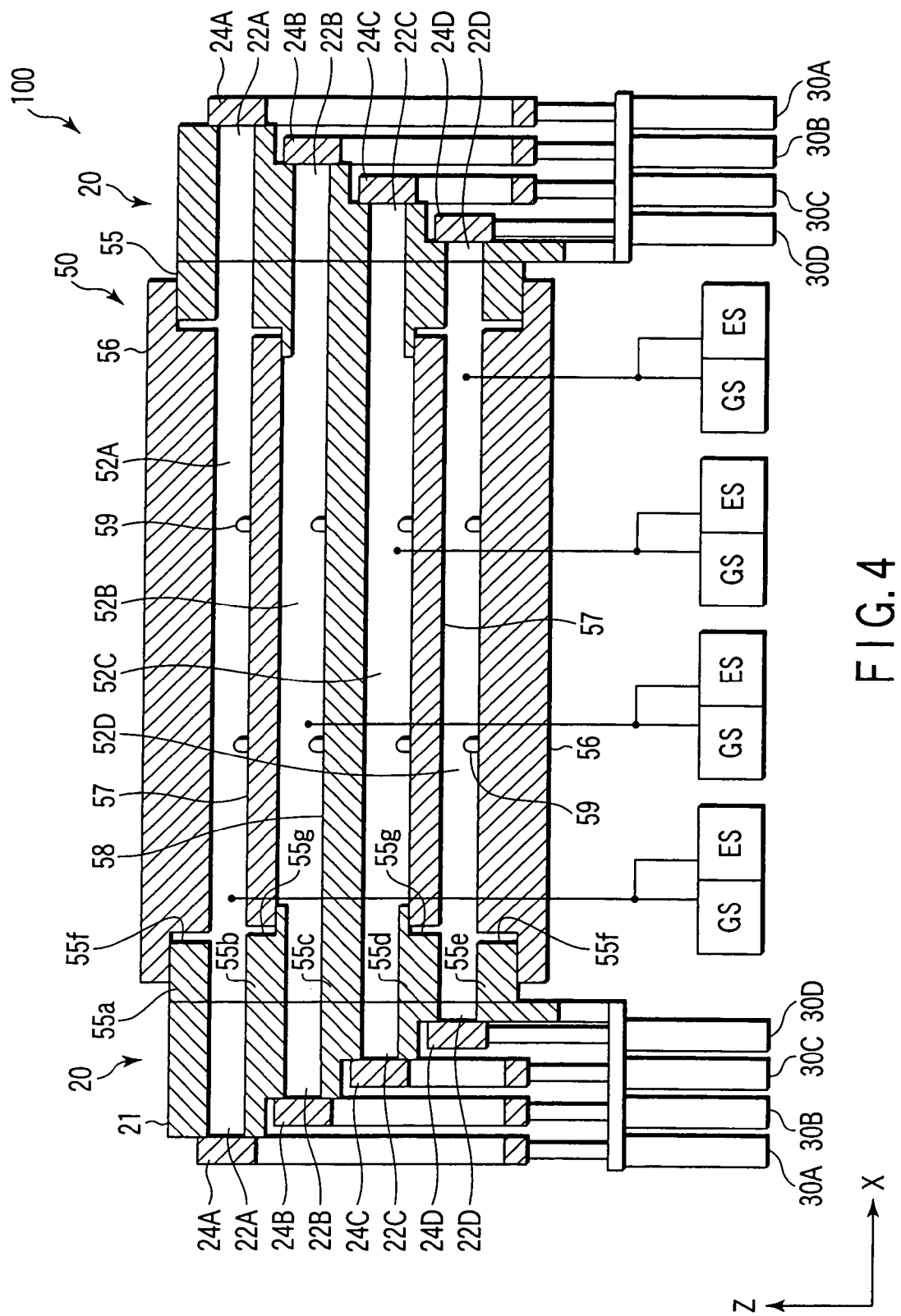
FIG. 4 is a sectional side view showing a load-lock apparatus formed of a container body and two gate valves the same as that described above and integratedly combined therewith.
Figure 5:
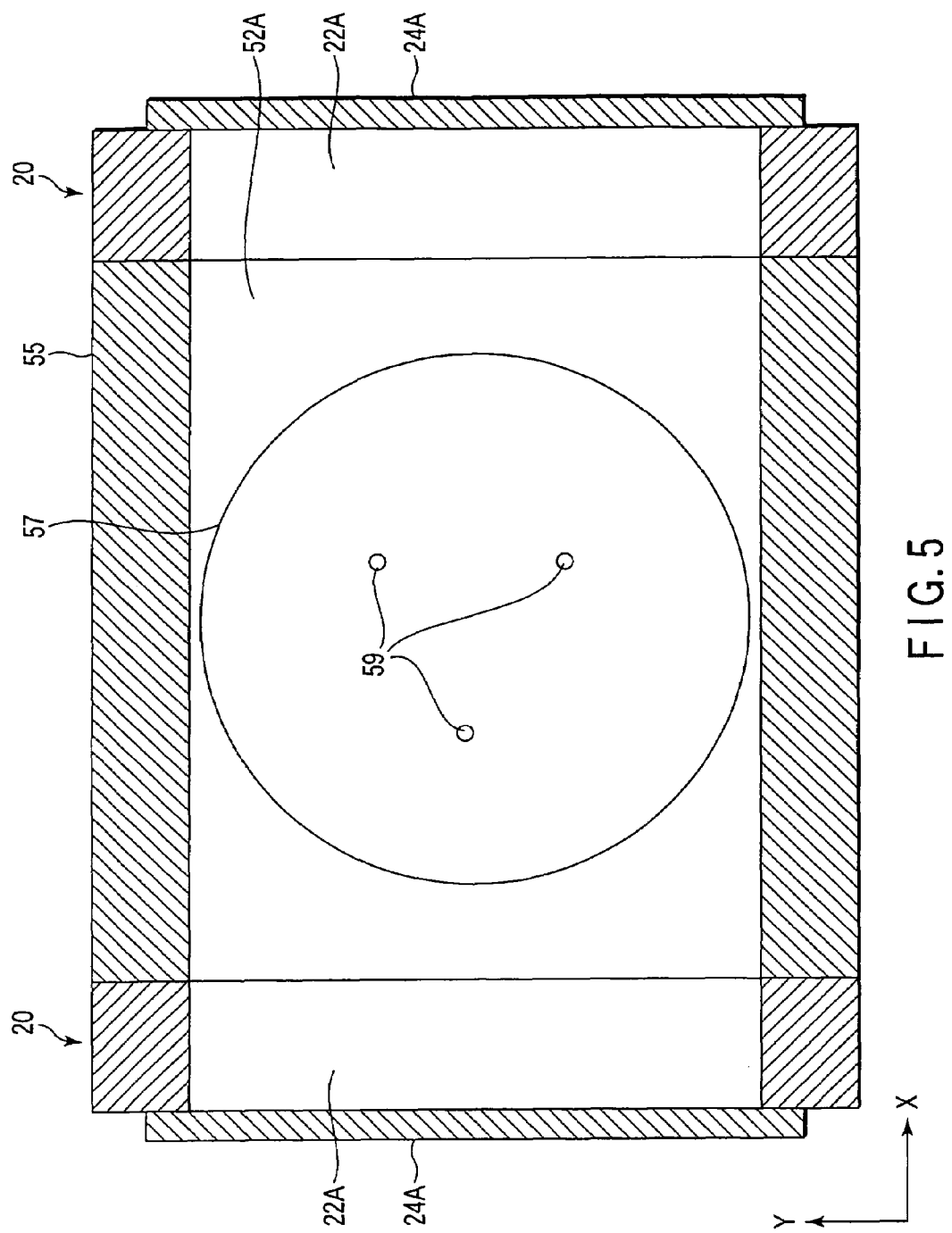
FIG. 5 is a sectional plan view showing the load-lock apparatus.

Next, an explanation will be give of a vacuum container employing such a gate valve 20. FIG. 4 is a sectional side view showing a load-lock apparatus 100 formed of a container body 50 and two gate valve 20 the same as that described above and integratedly combined therewith. FIG. 5 is a sectional plan view showing the load-lock apparatus 100. FIG. 3 also shows the relationship between the gate valve 20 and container body 50.

The load-lock apparatus (vacuum container) 100 includes a container body 50, which forms a plurality of (four in this example) load-lock chambers (vacuum chambers) 52A to 52D not communicating with each other. The gate valves 20 having a structure the same as that described above are respectively disposed on the opposite ends of the container body 50 in the X-direction. The load-lock chambers 52A to 52D horizontally extend in the X-direction and are stacked in the vertical direction (the Z-direction) to be parallel with each other. Each of the load-lock chambers 52A to 52D is connected to a supply section GS for supplying an inactive gas and an exhaust section ES for exhausting the gas, so that the inner pressure can be independently adjusted.

The container body 50 includes a box-like body casing 55, whose main portions including the peripheral wall are integrally formed. A partition wall 58 is integrally formed at the center of the body casing 55 in the vertical direction. The body casing 55 is combined with two cover plates 56 and two partition plates 57, which are formed separately from the body casing 55. The cover plates 56 and partition plates 57 are disposed symmetric with respect to the center of the partition wall 58 in the vertical direction. With this arrangement, the load-lock chambers 52A to 52D of the respective levels are formed between the partition wall 58 and partition plates 57, and between the cover plates 56 and partition plates 57.

The body casing 55 includes horizontal walls 55a to 55e formed at regular intervals in the vertical direction (Z-direction). The horizontal wall 55c at the central level in the vertical direction is formed as the partition wall 58 described above. The other horizontal walls 55a, 55b, 55d, and 55e are formed as walls having openings 55f and 55g at the center. The horizontal walls 55a, 55b, 55d, and 55e detachably support the cover plates 56 and partition plates 57 described above. The top and bottom cover plates 56 respectively function as the upper lid and lower lid. The upper surfaces of the bottom cover plates 56, two partition plates 57, and partition wall 58 are arranged as faces for mounting target substrates (such as semi-conductor wafers) thereon. For example, each of these faces is provided with pins 59 projecting therefrom for supporting a target substrate.

The gate valves 20 are detachably fixed to the end faces of the container body 50 by screws 41 (see FIG. 3). A seal member (not shown) for ensuring a sealing property is disposed between the rear-end face 21b of the housing 21 of each gate valve 20 and the corresponding end face of the container body 50. Where the gate valve 20 is connected to the container body 50, the passages 22A to 22D of the gate valve 20 communicate with the load-lock chambers 52A to 55D, respectively. Accordingly, it is possible to independently transfer target substrates into and from the load-lock chambers 52A to 52D, while operating the valve plates 24A to 24D of the gate valve 20 for opening/closing.

As described above, the container body 50, which has the load-lock chambers 52A to 52D stacked to form a multi-layer structure, is integrated with the gate valves 20 forming a multi-layer structure with a compact vertical dimension. In this case, the vertical intervals of the load-lock chambers 52A to 52D can be set as small as possible without reference to specific restrictions due to the dimensions of the gate valves 20. Accordingly, the number of stacked levels of the load-lock chambers 52A to 52D can be increased while reducing the vertical dimension. Furthermore, since the vertical dimension of the load-lock chambers is reduced, the time necessary for vacuum-exhausting each of them is shorter.

The load-lock apparatus shown in FIG. 4 has a structure in which a pair of gate valves are disposed on the opposite sides of a container body. Alternatively, there may be a vacuum process container arranged to have only one gate valve disposed on one side of a container body.

Figure 6:
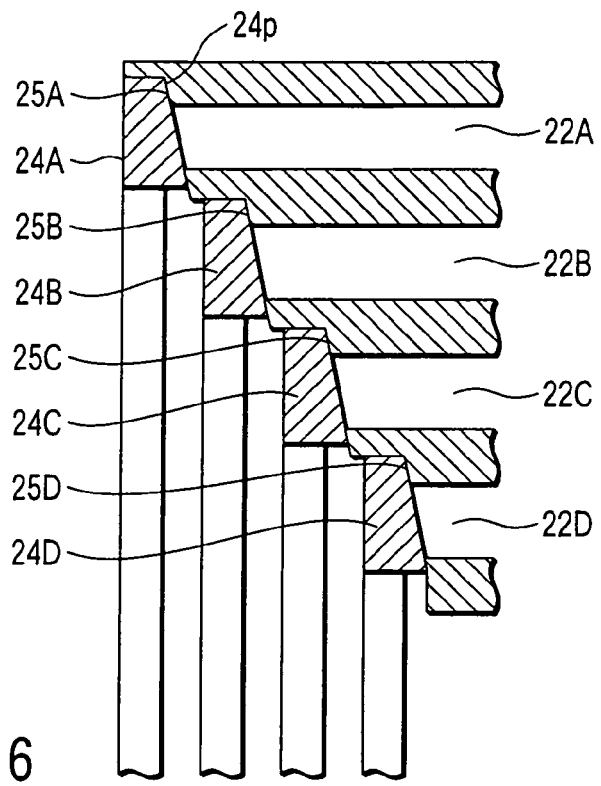
FIG. 6 is an enlarged sectional side view showing the relationship between the valve plates and valve seats of the gate valve.

FIG. 6 is an enlarged sectional side view showing the relationship between the valve plates 24A to 24D and valve seats 25A to 25D of the gate valve 20. Each of the contacting faces between the valve seats 25A to 25D and valve plates 24A to 24D is formed as a face inclined relative to the sliding direction of the valve plates 24A to 24D (or vertical direction=Z-direction). When the valve plates 24A to 24D are slid in the vertical direction and brought into contact with the valve seats 25A to 25D, the inclined surfaces come into close contact with each other, thereby ensuring the airtightness in the closing state.

Instead, a valve plate such as that disclosed in Jpn. Pat. Appln. KOKAI Publication No. 2-113178 may be employed. Alternatively, a valve plate may be arranged such that opening/closing a port is performed by a combination of vertical slide with horizontal movement.

Figure 7:
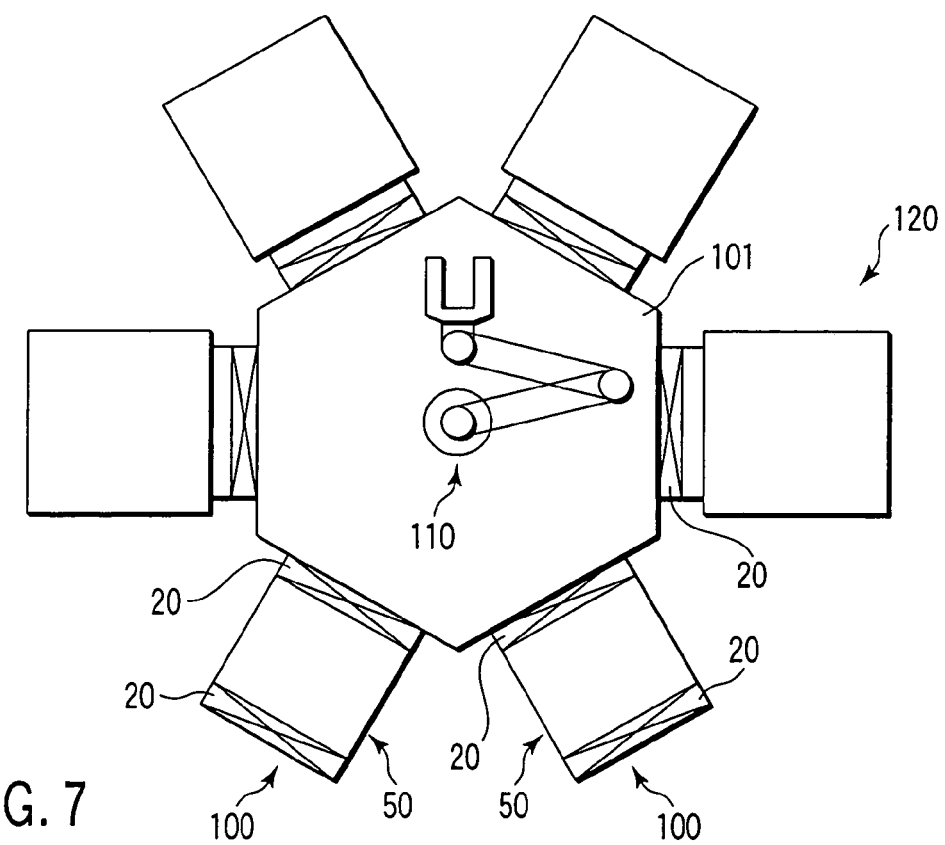
FIG. 7 is a plan view showing a vacuum processing system, which employs several gate valves the same as that described above.

FIG. 7 is a plan view showing a vacuum processing system, which employs several gate valves 20 the same as that described above. This vacuum processing system is of the cluster tool type (multi-chamber type). This vacuum processing system includes a central vacuum transfer chamber 101, a plurality of process chambers 120 disposed around it and connected thereto, and load-lock apparatuses 100 structured as shown in FIG. 4. Each of the chambers 120 is provided with a gate valve 20 structured as described above. The transfer chamber 101 is provided with a transfer robot 110 disposed therein to transfer a target substrate into and from the process chambers 120 and load-lock apparatuses 100. The gate valves 20 disposed around the vacuum transfer chamber 101 have actuating mechanisms 30A to 30D with drive rods respectively covered with bellows, so that the vacuum processing system is maintained airtight.

Figure 8:
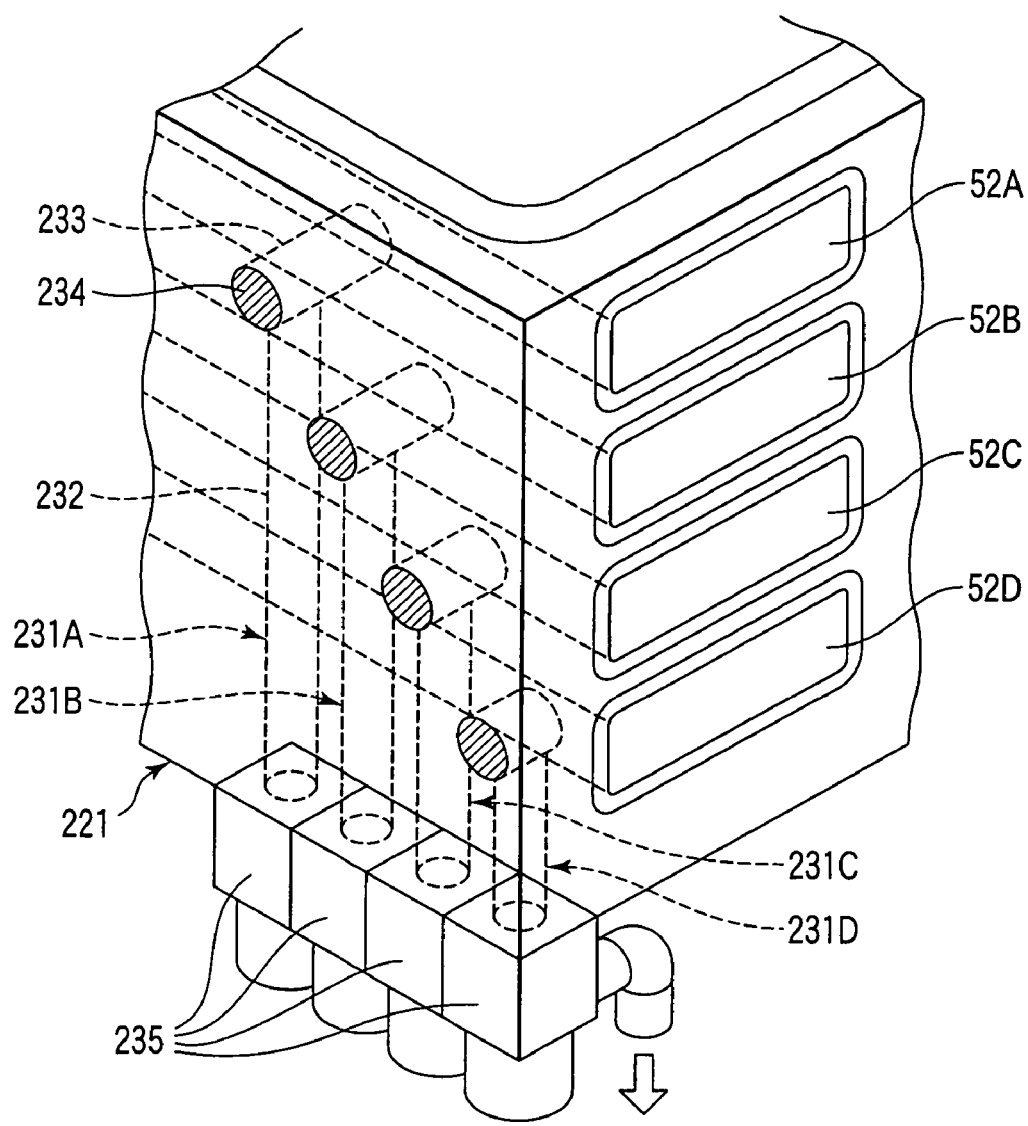
FIG. 8 is a perspective view showing a vacuum container according to another embodiment of the present invention.
Figure 10:
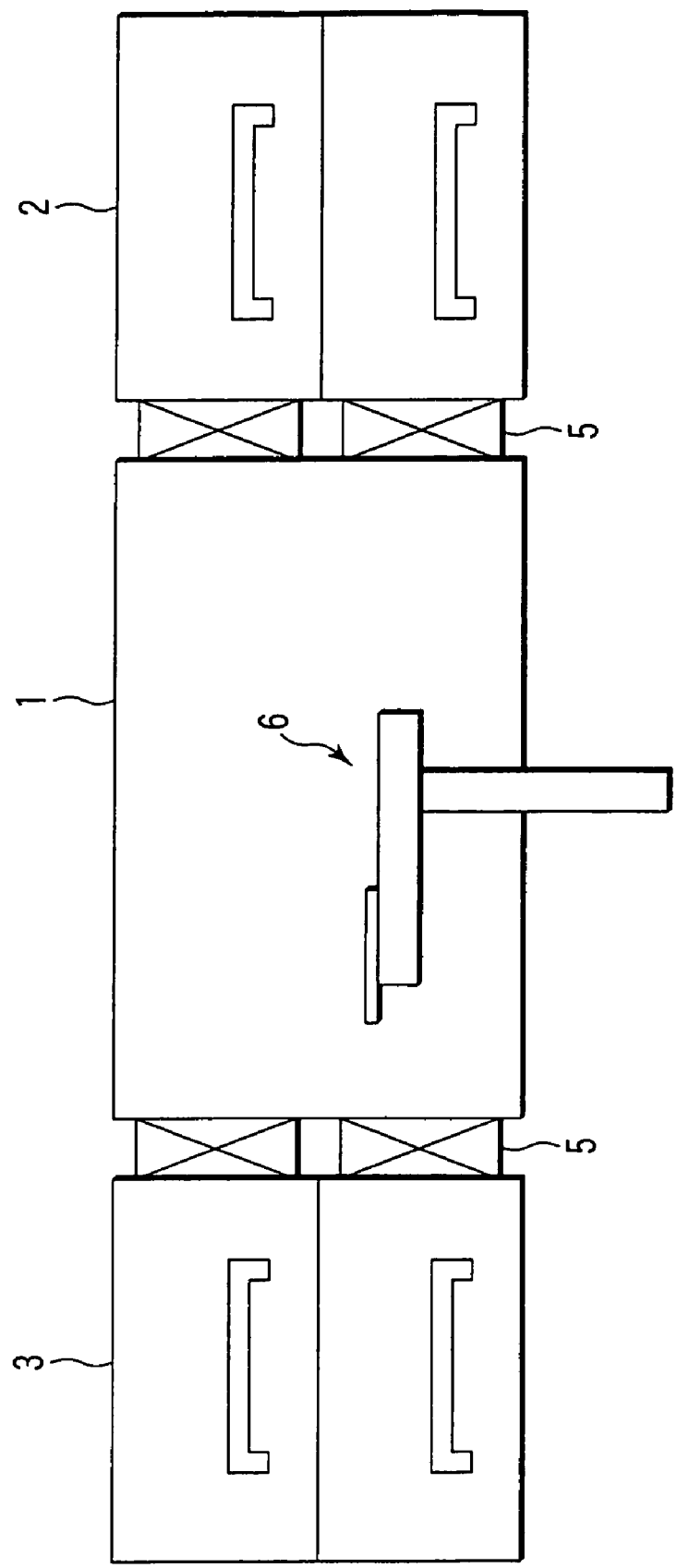
FIG. 10 is a sectional side view showing a conventional vacuum processing system.

FIGS. 8 and 9 are perspective views showing part of vacuum containers according to other embodiments of the present invention. As described above, a vacuum container, such as a load-lock apparatus, is connected to a gas supply section and an exhaust section, so that the inner pressure can be adjusted (see GS and ES in FIG. 4). For conventional vacuum processing systems, load-lock chambers, for example, are disposed at positions separate from each other, and thus the supply and exhaust passages for them are formed of independently disposed pipes. In this respect, the load-lock apparatus 100 shown in FIGS. 4 and 5 includes load-lock chambers (vacuum chambers) at a plurality of levels within one container body. If pipes are respective connected to the vacuum chambers, the number of piping parts increases, resulting in an increase in cost and difficulty in piping layout.

According to the embodiments shown in FIGS. 8 and 9, supply and exhaust passages are built as inner passages in the wall of a container body, so as to exclude outer pipes around the vacuum container. The embodiment shown in FIG. 8 has inner passages formed by a perforation process. The embodiment shown in FIG. 9 has inner passages integrally formed by casting.

In the embodiment shown in FIG. 8, the body casing 221 of the container body has load-lock chambers (vacuum chambers) 52A to 52D stacked to form a multi-layer structure. At least the peripheral wall portion of the body casing 221 is structured as one integrated wall unit. The wall unit includes inner passages 231A to 231D vertically formed therein, which are used as exhaust passages communicating with the load-lock chambers (vacuum chambers) 52A to 52D at the respective levels. Each of the inner passages 231A to 231D is formed of a vertical hole 232 and a horizontal hole 233 communicating with each other.

The vertical hole 232 is formed from the bottom of the body casing 221 to a position intersecting with the horizontal hole 233. The horizontal hole 233 is formed from the outer surface of the body casing 221 to extend to each of the load-lock chambers 52A to 52D. The opening of the horizontal hole 233 is closed with a plug 234. The bottom port of the vertical hole 232 is connected to an outer vacuum exhaust section through a manifold 235. Supply passages (not shown) are also formed in the same manner as the exhaust passages.

In the embodiment shown in FIG. 9, the body casing 321 of the container body is formed as one unit integrally formed by casting. The body casing 321 has load-lock chambers (vacuum chambers) 52A to 52D stacked to form a multi-layer structure. The upper surfaces of shelf plates 325 each for mounting a target substrate thereon, the attachment faces 330 of flanges 328 each for connecting a gate valve, and the upper surface of a top plate 327 having a fitting opening 326 for a lid board (not shown) are finished by polishing. The other surfaces that require no polishing are left as casting surfaces 360.

The peripheral wall portion of the body casing 321 includes exhaust (or supply) passages communicating with the load-lock chambers (vacuum chambers) 52A to 52D at the respective levels. These passages are formed as inner passages 331A to 331D vertically extending within wall portions projecting outward. The bottom port of each of the inner passages 331A to 331D is connected to an outer vacuum exhaust section (or a gas supply section) through a manifold 350.

As described above, according to the embodiments shown in FIGS. 8 and 9, supply and exhaust passages communicating with the respective load-lock chambers (vacuum chambers) 52A to 52D are formed as inner passages 231A to 231D or 331A to 331D built in a peripheral wall integrated with a container body (the body casing 221 or 321). With this arrangement, supply and exhaust lines can be assembled by connecting pipes from supply and exhaust sections to the ports of the inner passages together at the same time. Accordingly, it is possible to avoid the necessity for disposing outer pipes. It is also possible to reduce the piping part cost, simplify the piping layout, and reduce leakage probability for a smaller number of sealing portions.

Embodiments of the present invention have been described with reference to the accompanying drawings, though the present invention is not limited to these embodiments. Various modifications and changes within the spirit of the present invention may be anticipated. For example, in the embodiment shown in FIGS. 1A and 1B, the housing 21 of the gate valve 20 is integratedly formed. However, the housing may be formed of a combination of several small housings, such that the small housings, each of which has at least one passage, are stacked and connected.

The gate valve 20 may be assembled on site, employing a housing unit and an operation unit separately manufactured. In this modification, the housing unit includes the housing 21 that forms the passages 22A to 22D and valve seats 25A to 25D. On the other hand, the operation unit includes the valve plates 24A to 24D and actuating mechanisms 30A to 30D.

In the embodiment shown in FIG. 4, the housing 21 of the gate valve 20 and the body casing 55 of the container body 50 are prepared as separate bodies. However, they may be manufactured as one integrally formed body. The number of stacked passages 22A to 22D may be any number, as long as it is two or more. Where a vacuum container, which is formed of a container body and one or two gate valves, is provided with a heating device or cooling device disposed therein, the vacuum container can be used as a heating chamber or cooling chamber. A transfer object (target substrate) may be an LCD substrate other than a semiconductor wafer.

INDUSTRIAL APPLICABILITY

According to the present invention, there is provided a gate valve and vacuum container for a semiconductor processing system, which have a plurality of stacked passages and are compact.

The invention claimed is:

1. A gate valve operation unit for a semiconductor processing system, the gate valve comprising ports respectively provided with valve seats, which are arrayed in a first direction and are respectively disposed at gradually set back positions in a second direction perpendicular to the first direction, the gate valve operation unit comprising:

valve plates configured to selectively engage with the valve seats by sliding in the first direction to respectively open/close the ports, the valve plates being arrayed in the second direction correspondingly to positions of the valve seats in the second direction; and actuating mechanisms respectively provided for the valve plates, each of the actuating mechanisms being configured to slide a corresponding one of the valve plates between a first position to close a corresponding one of the ports and a second position to open the corresponding one of the ports.

2. The operation unit according to claim 1, wherein each of the valve plates, except for one of the valve plates closest to the second predetermined side, is connected to a corresponding one of the actuating mechanisms through a pair of rods disposed with a gap therebetween in a third direction perpendicular to the first and second directions, and the gap between the rods is set to be larger than a width of a transfer object transferred through the ports.

3. A gate valve for a semiconductor processing system, the gate valve comprising:

a housing forming a plurality of passages arrayed in a first direction, the passages respectively having ports facing a first predetermined side in a second direction perpendicular to the first direction;

valve seats respectively disposed at the ports, the valve seats being respectively disposed at gradually set back positions in the second direction, as being closer to a second predetermined side in the first direction;

valve plates configured to selectively engage with the valve seats by sliding in the first direction to respectively open/close the ports, the valve plates being arrayed in the second direction correspondingly to positions of the valve seats in the second direction; and actuating mechanisms respectively provided for the valve plates, each of the actuating mechanisms being configured to slide a corresponding one of the valve plates between a first position to close a corresponding one of the ports and a second position to open the corresponding one of the ports.

4. The gate valve according to claim 3, wherein the second position is closer to the second predetermined side than the first position is.

5. The gate valve according to claim 4, wherein the valve plates are set to have the same stroke between the first and second positions.

6. The gate valve according to claim 5, wherein the stroke is set to be substantially the same as a distance between centers of the ports in the first direction.

7. The gate valve according to claim 4, wherein the actuating mechanisms are configured to cause two valve plates of the valve plates adjacent to each other to slide independently of each other.

8. The gate valve according to claim 3, wherein each of the valve plates, except for one of the valve plates closest to the second predetermined side, is connected to a corresponding one of the actuating mechanisms through a pair of rods disposed with a gap therebetween in a third direction perpendicular to the first and second directions, and the gap between the rods is set to be larger than a width of a transfer object transferred through the ports.

9. A vacuum container for a semiconductor processing system, the vacuum container comprising:
   a container body forming a plurality of vacuum chambers arrayed in a first direction; and
   a first gate valve disposed at a first end of the container body and configured to open/close the vacuum chambers,
   where the first gate valve comprises
   a housing forming a plurality of passages arrayed in the first direction and respectively communicating with the vacuum chambers, the passages respectively having ports facing a first predetermined side in a second direction perpendicular to the first direction,
   valve seats respectively disposed at the ports, the valve seats being respectively disposed at gradually set back positions in the second direction, as being closer to a second predetermined side in the first direction,
   valve plates configured to selectively engage with the valve seats by sliding in the first direction to respectively open/close the ports, the valve plates being arrayed in the second direction correspondingly to positions of the valve seats in the second direction, and
   actuating mechanisms respectively provided for the valve plates, each of the actuating mechanisms being configured to slide a corresponding one of the valve plates between a first position to close a corresponding one of the ports and a second position to open the corresponding one of the ports.

10. The vacuum container according to claim 9, further comprising a supply section for supplying an inactive gas and an exhaust section for exhausting the gas, which are connected to the vacuum chambers, wherein the vacuum chambers function as load-lock chambers for adjusting pressure.

11. The vacuum container according to claim 10, further comprising a second gate valve disposed at a second end of the container body opposite to the first end and configured to open/close the vacuum chambers and have substantially the same function as the first gate valve, wherein the first and second gate valves have structures substantially symmetric with respect to a center of the container body.

12. The vacuum container according to claim 10, wherein the container body comprises a peripheral wall portion, which is an integrally formed wall unit with passages built therein for the supply section and the exhaust section.

* * * * *